(12) United States Patent
Kim et al.

(10) Patent No.: US 11,283,280 B2
(45) Date of Patent: Mar. 22, 2022

(54) BATTERY MANAGEMENT APPARATUS, BATTERY MANAGEMENT METHOD, BATTERY PACK AND ELECTRIC VEHICLE

(71) Applicant: LG CHEM, LTD., Seoul (KR)

(72) Inventors: Dae-Soo Kim, Daejeon (KR);
Yoon-Jung Bae, Daejeon (KR);
Young-Deok Kim, Daejeon (KR);
Song-Yi Han, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 121 days.

(21) Appl. No.: 16/767,782

(22) PCT Filed: Aug. 29, 2019

(86) PCT No.: PCT/KR2019/011093
§ 371 (c)(1),
(2) Date: May 28, 2020

(87) PCT Pub. No.: WO2020/046019
PCT Pub. Date: Mar. 5, 2020

(65) Prior Publication Data
US 2020/0366115 A1    Nov. 19, 2020

(30) Foreign Application Priority Data

Aug. 29, 2018 (KR) .................. 10-2018-0102259
Aug. 28, 2019 (KR) .................. 10-2019-0106025

(51) Int. Cl.
*H02J 7/00* (2006.01)
*G01R 31/392* (2019.01)
(Continued)

(52) U.S. Cl.
CPC ........ *H02J 7/007182* (2020.01); *B60L 58/10* (2019.02); *G01R 31/3842* (2019.01);
(Continued)

(58) Field of Classification Search
CPC .. H02J 7/007182; H02J 7/00712; H02J 7/005; H02J 7/0047; B60L 58/10;
(Continued)

(56) References Cited

U.S. PATENT DOCUMENTS 4,460,870 A    7/1984  Finger
9,709,635 B2*  7/2017  Zhong ................. G01R 31/367
(Continued)

FOREIGN PATENT DOCUMENTS

CN    101855773 B  *  1/2015  ............ H02J 7/0014
CN    104577238 A  *  4/2015  ............ H01M 10/48
(Continued)

OTHER PUBLICATIONS

Extended European Search Report dated Jan. 29, 2021, issued in corresponding European Patent Application No. 19855538.5.
(Continued)

*Primary Examiner* — M Baye Diao
(74) *Attorney, Agent, or Firm* — Morgan, Lewis & Bockius LLP

(57) ABSTRACT

A battery management apparatus, including: a sensing unit configured to generate battery information indicating a battery voltage and current; and a control unit configured to: determine a differential voltage curve based on a history of the battery information from the sensing unit during a sensing period while the battery is being charged with a first current rate current, the differential voltage curve indicating a relationship between a remaining capacity of the battery and a ratio of a voltage change amount of the battery to a remaining capacity change amount of the battery during the sensing period; detect feature points from the differential voltage curve; determine whether stabilization for an electrode material of the battery is required, based on a feature value of each of the feature points; and output a control
(Continued)

signal to induce the battery to be discharged with a smaller second current rate current, when stabilization is required.

12 Claims, 7 Drawing Sheets

(51) Int. Cl.
  *G01R 31/3842* (2019.01)
  *B60L 58/10* (2019.01)
  *H01M 10/42* (2006.01)
  *H01M 10/48* (2006.01)

(52) U.S. Cl.
  CPC ........ *G01R 31/392* (2019.01); *H01M 10/425* (2013.01); *H01M 10/48* (2013.01); *H02J 7/0047* (2013.01); *B60L 2240/547* (2013.01); *B60L 2240/549* (2013.01); *H01M 2010/4271* (2013.01); *H01M 2220/20* (2013.01)

(58) Field of Classification Search
  CPC ........ B60L 2240/547; B60L 2240/549; G01R 31/3835; G01R 31/3842; G01R 31/392; G01R 31/367; Y02E 60/10; Y02T 10/70; H01M 10/44; H01M 10/425; H01M 10/48; H01M 2220/20; H01M 2010/4271
  USPC ........................................................ 320/134
  See application file for complete search history.

(56) References Cited

U.S. PATENT DOCUMENTS

| | | |
|---|---|---|
| 2009/0243548 A1 | 10/2009 | Hoff |
| 2011/0012604 A1 | 1/2011 | Tsujiko et al. |
| 2012/0056590 A1 | 3/2012 | Amiruddin et al. |
| 2013/0335009 A1* | 12/2013 | Katsumata ........... G01R 31/392 320/107 |
| 2014/0236509 A1 | 8/2014 | Kim |
| 2015/0340885 A1 | 11/2015 | Baek et al. |
| 2016/0061908 A1 | 3/2016 | Torai et al. |
| 2016/0146895 A1 | 5/2016 | Yazami |
| 2016/0195589 A1 | 7/2016 | Hanyu et al. |
| 2017/0038436 A1 | 2/2017 | Montaru |
| 2017/0212170 A1 | 7/2017 | Torai et al. |
| 2017/0234930 A1 | 8/2017 | Lee et al. |
| 2018/0164384 A1 | 6/2018 | Kwon et al. |
| 2021/0046844 A1* | 2/2021 | Bae .......................... B60L 3/12 |
| 2021/0199723 A1* | 7/2021 | Kim ................. G01R 19/16542 |

FOREIGN PATENT DOCUMENTS

| | | | |
|---|---|---|---|
| JP | 2003009408 A | * 1/2003 | ............. B60L 50/16 |
| JP | 2009-252381 A | 10/2009 | |
| JP | 2016-53564 A | 4/2016 | |
| JP | 5940145 B2 | 6/2016 | |
| JP | 6301048 B1 | 3/2018 | |
| KR | 10-2010-0131002 A | 12/2010 | |
| KR | 10-2014-0104893 A | 8/2014 | |
| KR | 10-2015-0133587 A | 11/2015 | |
| KR | 10-2016-0144437 A | 12/2016 | |
| KR | 10-2017-0023583 A | 3/2017 | |
| KR | 10-2017-0073314 A | 6/2017 | |
| KR | 10-2018-0068708 A | 6/2018 | |
| KR | 10-2018-0089698 A | 8/2018 | |
| WO | 2013/157132 A1 | 10/2013 | |

OTHER PUBLICATIONS

International Search Report issued in corresponding International Patent Application No. PCT/KR2019/011093, dated Dec. 26, 2019.
Office Action dated Apr. 20, 2021, issued in corresponding Japanese Patent Application No. 2020-520069.

* cited by examiner though it has almost no memory effect, allows free charge and discharge, and has a very low self-discharge rate and a high energy density, compared to the nickel-based battery.

BATTERY MANAGEMENT APPARATUS, BATTERY MANAGEMENT METHOD, BATTERY PACK AND ELECTRIC VEHICLE

TECHNICAL FIELD

The present disclosure relates to a battery management apparatus, a battery management method, a battery pack and an electric vehicle, for monitoring a state of a battery.

The present application claims priority to Korean Patent Application No. 10-2018-0102259 filed on Aug. 29, 2018 and Korean Patent Application No. 10-2019-0106025 filed on Aug. 28, 2019 in the Republic of Korea, the disclosures of which are incorporated herein by reference.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Currently commercially available batteries include nickel cadmium batteries, nickel hydrogen batteries, nickel zinc batteries, lithium batteries and the like. Among them, the lithium battery is spotlighted because it has almost no memory effect, allows free charge and discharge, and has a very low self-discharge rate and a high energy density, compared to the nickel-based battery.

The battery gradually deteriorates with repeated charging and discharging. Accordingly, in order to diagnose the state of degradation of the battery, a differential voltage analysis (also referred to as 'DVA') for obtaining information about the state of degradation of the battery from a differential voltage curve (also referred to as 'Q-dV/dQ curve') of the battery may be used.

However, if the differential voltage analysis is applied to battery information collected in a state where the electrode material of the battery is unstable, inaccurate results may be obtained on the state of degradation of the battery due to noise components in the battery information.

DISCLOSURE

Technical Problem

The present disclosure is designed to solve the problems of the related art, and therefore the present disclosure is directed to providing a battery management apparatus, a battery management method, a battery pack and an electric vehicle, which may selectively execute a process for stabilizing an electrode material of a battery by analyzing a plurality of feature points in a differential voltage curve that is determined from battery information indicating a voltage history and a current history of the battery.

Also, the present disclosure is directed to providing a battery management apparatus, a battery management method, a battery pack and an electric vehicle, which may determine the degree of degradation of an electrode from a remaining capacity difference between two feature points associated with the state of degradation of the electrode of the battery, among the plurality of feature points in the differential voltage curve.

Technical Solution

A battery management apparatus according to one aspect of the present disclosure comprises: a sensing unit configured to generate battery information indicating a voltage and current of a battery; and a control unit operably coupled to the sensing unit. The control unit is configured to determine a differential voltage curve based on a history of the battery information provided from the sensing unit during a sensing period while the battery is being charged with a current of a first current rate. The differential voltage curve indicates a relationship between a remaining capacity of the battery and a ratio of a voltage change amount of the battery to a remaining capacity change amount of the battery during the sensing period. The control unit is configured to detect a plurality of feature points from the differential voltage curve. The control unit is configured to determine whether stabilization for an electrode material of the battery is required, based on a feature value of each of the plurality of feature points. The control unit is configured to output a control signal to induce the battery to be discharged with a current of a second current rate, when it is determined that stabilization for the electrode material of the battery is required. The second current rate is smaller than the first current rate.

The control unit may be configured to calculate an absolute value of a difference between the feature values of every pair of two neighboring feature points among the plurality of feature points. The control unit may be configured to determine whether stabilization for the electrode material of the battery is required by comparing an average of the absolute values calculated for the every pair with a reference value.

The control unit may be configured to determine that stabilization for the electrode material of the battery is required, when the average is equal to or greater than the reference value.

The control unit may be configured to determine the second current rate based on a first stabilization factor associated with a ratio between the reference value and the average, when it is determined that stabilization for the electrode material of the battery is required.

The second current rate may be equal to the product of the first stabilization factor and a threshold current rate. The threshold current rate may be a maximum current rate available in a stabilization process.

The control unit may be configured to determine a relaxation time based on a second stabilization factor associated with a ratio between the reference value and the average, when it is determined that stabilization for the electrode material of the battery is required. The control unit may be configured to output the control signal at a time point when the relaxation time passes from an end of the sensing period.

The second stabilization factor may be a reciprocal of the first stabilization factor. The relaxation time may be equal to the product of the second stabilization factor and a threshold time.

A battery pack according to another aspect of the present disclosure comprises the battery management apparatus.

An electric vehicle according to still another aspect of the present disclosure comprises the battery pack.

A battery management method according to further another aspect of the present disclosure comprises: collecting the battery information from the sensing unit during the sensing period; determining the differential voltage curve based on the history of the collected battery information; detecting the plurality of feature points from the differential voltage curve; determining whether stabilization for the electrode material of the battery is required, based on a feature value of each of the plurality of feature points; and outputting the control signal to induce the battery to be discharged with a current of the second current rate, when it is determined that stabilization for the electrode material of the battery is required. The second current rate is smaller than the first current rate.

It may be determined that stabilization for the electrode material of the battery is required, when an average of an absolute value of a difference between the feature values of every pair of two neighboring feature points among the plurality of feature points is equal to or greater than a reference value.

The second current rate may be equal to the product of a first stabilization factor associated with a ratio between the reference value and the average and a threshold current rate. The threshold current rate may be a maximum current rate available in a stabilization process.

Advantageous Effects

According to at least one of the embodiments of the present disclosure, it is possible to selectively execute a process for stabilizing an electrode material of a battery by analyzing a plurality of feature points in a differential voltage curve that is determined from battery information indicating a voltage history and a current history of the battery.

Also, according to at least one of the embodiments of the present disclosure, it is possible to determine the degree of degradation of an electrode from a remaining capacity difference between two feature points associated with the state of degradation of an electrode (namely, a positive electrode or a negative electrode) of the battery, among the plurality of feature points in the differential voltage curve, without performing the three-electrode experiment.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure based on the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term <control unit> described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
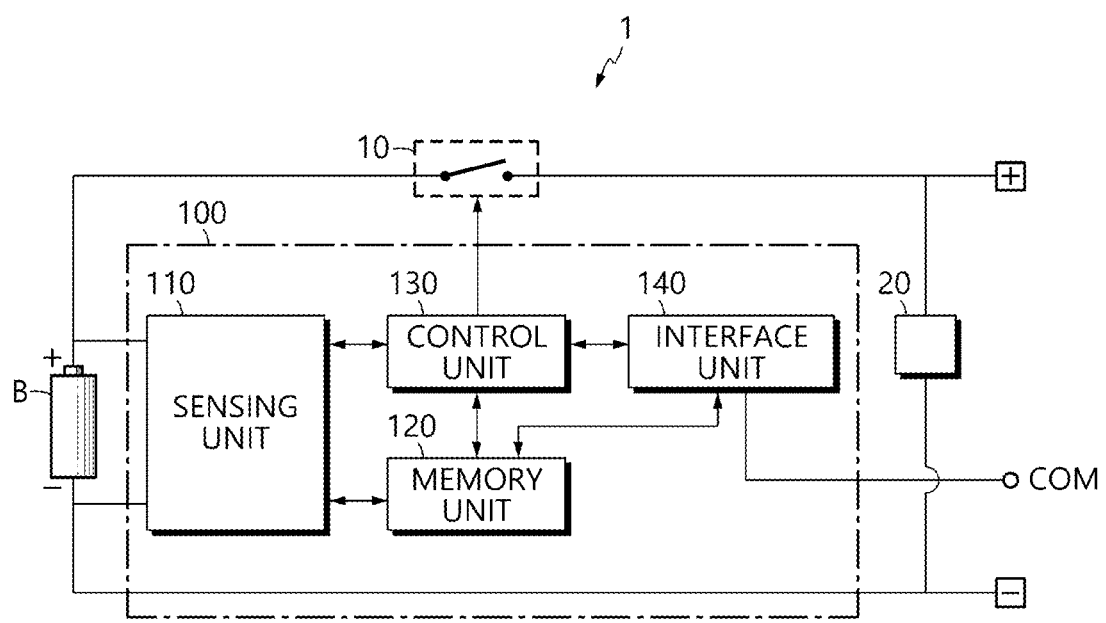
FIG. 1 is a diagram schematically showing the configuration of a battery pack including a battery management apparatus according to an embodiment of the present disclosure.
Figure 2:
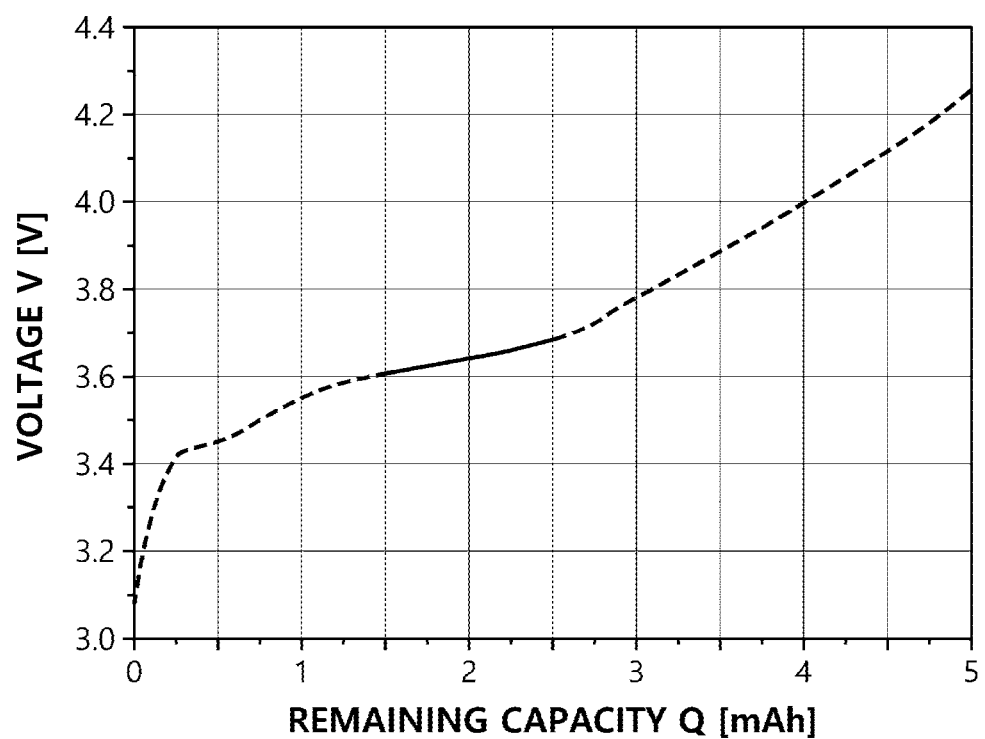
FIG. 2 is a graph exemplarily showing a voltage curve of the battery illustrated in FIG. 1.
Figure 3:
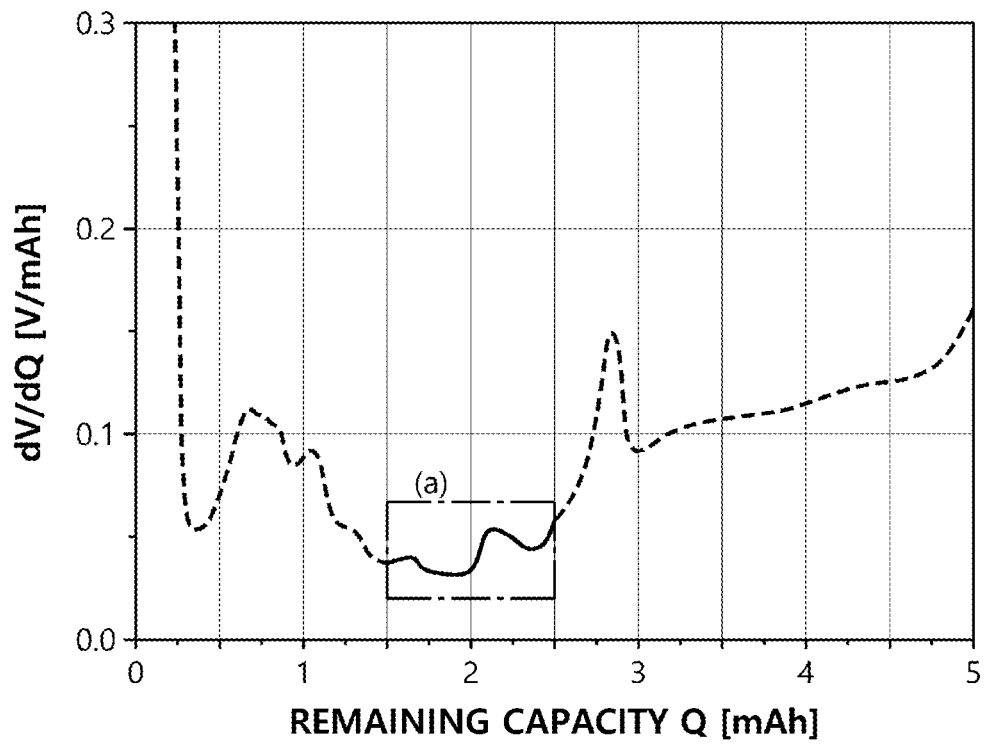
FIG. 3 is a graph exemplarily showing a differential voltage curve associated with the voltage curve of FIG. 2.
Figure 4:
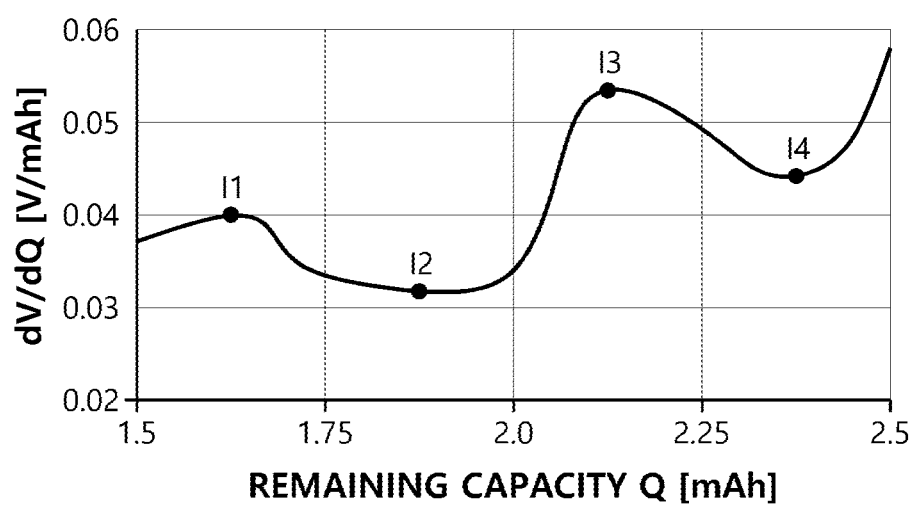
FIG. 4 is a graph showing a region A of FIG. 3 in an enlarged view.

FIG. 1 is a diagram schematically showing the configuration of a battery pack including a battery management apparatus according to an embodiment of the present disclosure, FIG. 2 is a graph exemplarily showing a voltage curve of the battery illustrated in FIG. 1, FIG. 3 is a graph exemplarily showing a differential voltage curve associated with the voltage curve of FIG. 2, and FIG. 4 is a graph showing a region A of FIG. 3 in an enlarged view.

Referring to FIG. 1, a battery pack 1 includes a battery B, a relay 10, a charging-discharging circuit 20, and a battery management apparatus 100. The battery pack 1 is mounted to a power device such as an electric vehicle to supply an electric energy required for driving the power device. The battery management apparatus 100 is provided to be electrically connected to a positive electrode terminal and a negative electrode terminal of the battery B. The battery management apparatus 100 may selectively execute a process for stabilizing an electrode material of the battery B.

The battery B includes one unit cell or a plurality of unit cells electrically connected in series and/or in parallel. The unit cell is not particularly limited as long as it is able to be repeatedly charged and discharged, like a pouch-type lithium ion cell.

The battery B may be electrically coupled to an external device through power terminals (+, −) of the battery pack 1. The external device may be, for example, an electric load (e.g., a motor) such as an electric vehicle, a DC-AC inverter, a charger, or the like.

The battery management apparatus 100 may include a sensing unit 110, a memory unit 120, a control unit 130, and an interface unit 140.

The sensing unit 110 is operably coupled with the control unit 130. That is, the sensing unit 110 may be communicatively connected to the control unit 130 to transmit an electrical signal to the control unit 130 or to receive an electrical signal from the control unit 130.

The sensing unit 110 may include a voltage sensor configured to measure a voltage of the battery B. The voltage sensor may periodically measure a voltage across the battery B and provide a voltage measurement signal indicating the measured voltage to the control unit 130.

The sensing unit 110 may include a current sensor configured to measure a current of the battery B. The current sensor periodically measures a current flowing through the battery B and provides a current measurement signal indicating a direction and magnitude of the measured current to the control unit 130. Hereinafter, the voltage measurement signal and the current measurement signal will be collectively referred to as 'battery information'.

In hardware, the control unit 130 may be implemented to include at least one of application specific integrated circuits (ASICs), digital signal processors (DSPs), digital signal processing devices (DSPDs), programmable logic devices (PLDs), field programmable gate arrays (FPGAs), microprocessors, other electrical units for performing other functions.

The control unit 130 is operably coupled to the sensing unit 110, the memory unit 120, the interface unit 140 and the charging-discharging circuit 20. The control unit 130 may perform signal processing (e.g., analog-to-digital conversion) to convert the battery information to a digital value (hereinafter, also referred to as a 'voltage value') indicating the voltage of the battery B and a digital value (hereinafter, also referred to as a 'current value') indicating the current of the battery B, and store each digital value in the memory unit 120.

The memory unit 120 records, erases and updates data generated by the control unit 130 and stores a plurality of program codes provided for stabilizing the electrode of the battery B. The memory unit 120 may store preset values of various predetermined parameters used when implementing the present disclosure.

The memory unit 120 is not particularly limited as long as it is a semiconductor memory device known to be capable of recording, erasing and updating data. For example, the memory unit 120 may be a DRAM, an SDRAM, a flash memory, a ROM, an EEPROM, a register, or the like. The memory unit 120 may further include a storage medium in which program codes defining control logics of the control unit 130 are stored. The storage medium includes a flash memory or a non-volatile storage element such as a hard disk. The memory unit 120 may be physically separated from the control unit 130 or may be integrated with the control unit 130.

The control unit 130 may control a current rate (also referred to as a 'C-rate') of the current flowing through the battery B when the battery B is charged or discharged.

The control unit 130 may periodically update the remaining capacity of the battery B by periodically integrating a value of the current flowing through the battery B over time. Here, other known methods such as a Kalman filter may also be used to update the remaining capacity.

The control unit 130 may control an on/off state of the relay 10 provided to open and close a current path between the power terminals (+, −). The control unit 130 may control the charging-discharging circuit 20 provided to adjust the current rate of the current flowing through the battery B.

The control unit 130 may determine a first current rate using Equation 1 below.

$$I_c = K_1 \times C_n \qquad \text{<Equation 1>}$$

In Equation 1, $I_c$ may be a first current rate, $K_1$ may be a predetermined first conditioning value that is a constant equal to or less than 1, and $C_n$ may be a predetermined maximum current rate associated with the battery B. $K_1$ may be predetermined in consideration of the electrochemical characteristics of the battery B. Since $K_1$ is 1 or below, the first current rate $I_c$ is equal to or less than the maximum allowable current rate $C_n$. If stabilization for the electrode material of the battery B is not required, a differential voltage curve of the battery B may be determined from a voltage history and a current history of the battery B that is obtained while the battery B is charged or discharged with a constant current of the first current rate $I_c$.

Referring to FIG. 2, the control unit 130 may determine a voltage curve (also referred to as a 'QV curve') of the battery B indicating a corresponding relationship between the remaining capacity history and the voltage history of the battery B based on the history of the battery information provided from the sensing unit 110 during the sensing period while the battery B is being charged (or discharged) with a constant current (e.g., the first current rate). The sensing period may have a predetermined time length. For example, the control unit 130 may output a control signal to the charging-discharging circuit 20 so as to induce the charging-discharging circuit 20 to charge the battery B with the constant current for the predetermined time length from a time point when SOC (State Of Charge) of the battery B is a predetermined initial value (e.g., 0%). The voltage curve may be stored in the memory unit 120 as a function of approximating the remaining capacity of the battery B according to the voltage of the battery B into a curve. Alternatively, the V-Q curve may be stored in the memory unit 120 in the form of a lookup table.

The control unit 130 may generate a differential voltage curve (also referred to as a 'Q-dV/dQ curve') (see FIG. 3) from the voltage curve (see FIG. 2) of the battery B. Specifically, the control unit 130 may determine a voltage V, a remaining capacity Q, a voltage change amount dV and a remaining capacity change amount dQ of the battery B at every unit time from the voltage curve shown in FIG. 2. The differential voltage curve shown in FIG. 3 represents a corresponding relationship between (i) the remaining capacity Q of the battery B and (ii) a ratio dV/dQ of the voltage change amount dV of the battery B to the remaining capacity change amount dQ of the battery B.

The control unit 130 may analyze the differential voltage curve to determine whether stabilization for the electrode material of the battery B is required. In detail, the control unit 130 may detect a plurality of feature points from the differential voltage curve. Each feature point may represent a remaining capacity Q on the differential voltage curve that satisfies a predetermined condition. Each feature point may be referred to as a "peak" and may be a maximum point or a minimum point located on the differential voltage curve. That is, the feature point of the differential voltage curve may indicate an inflection point of the voltage curve.

For example, the control unit 130 may detect, as a feature point, a remaining capacity Q of each maximum point at which a first-order differential coefficient and a second-order differential coefficient of the differential voltage curve become 0 and a negative number, respectively. As another example, a remaining capacity Q of each minimum point at which the first-order differential coefficient and the second-order differential coefficient of the differential voltage curve become 0 and a positive number, respectively, may be detected as a feature point. dV/dQ at each feature point may be called a "feature value" or a "differential voltage". The unit of the feature value may be V/mAh, and, hereinafter, the unit may be omitted. As shown in FIG. 4, it is assumed that four feature points I1, I2, I3, I4 are detected from a portion inside a region A of the differential voltage curve shown in FIG. 3. The region A may correspond to a predetermined range (e.g., 1.5 to 2.5 mAh).

The control unit 130 may determine whether stabilization for the electrode material of the battery B is required based on the difference between the feature values of the feature points I1, I2, I3, I4.

The control unit 130 may calculate an absolute value of a difference in feature values of every pair of two neighboring feature points among the feature points I1, I2, I3, I4.

Next, the control unit 130 may calculate an average of absolute values calculated for every pair of two neighboring feature points among the feature points I1, I2, I3, I4. At this time, the control unit 130 may use Equation 2 below.

$$E_{cv} = \frac{1}{n-1} \times \sum_{i=1}^{n-1} |CV_i - CV_{i+1}| \qquad \langle\text{Equation 2}\rangle$$

In Equation 2, n is a total number of the feature points I1, I2, I3, I4 detected in the region A, $CV_i$ is a feature value of an $i^{th}$ feature point among the feature points I1, I2, I3, I4, and $E_{cv}$ is the average.

It is assumed that the feature values of the feature points I1, I2, I3, I4 are 0.0390, 0.030, 0.0510 and 0.0430 in order. Then, the control unit 130 may calculate an absolute value 0.0090 of a difference between 0.0390 and 0.0300 that are feature values of two neighboring feature points I1, I2. The control unit 130 may calculate an absolute value 0.0210 of a difference between 0.0300 and 0.0510 that are feature values of two neighboring feature points I2, I3. The control unit 130 may calculate an absolute value 0.0080 of a difference between 0.0510 and 0.0430 that are feature values of two neighboring feature points I3, I4. Thus, the average may be calculated as $E_{cv} \approx 0.0127$.

The control unit 130 may determine whether or not to execute a stabilization process by comparing the average with a reference value. The reference value may be a predetermined constant.

If the average is greater than the reference value, the control unit 130 may determine to execute the stabilization process. Meanwhile, if the average is equal to or less than the reference value, the control unit 130 may determine to suspend the stabilization process. For example, if the reference value is 0.0120 smaller than the average $E_{cv}$, the control unit 130 may determine that stabilization for the electrode material of the battery B is required. As another example, if the reference value is 0.0130 greater than $E_{cv}$, the control unit 130 may determine that stabilization for the electrode material of the battery B is not required.

If it is determined to execute the stabilization process, the control unit 130 may determine a second current rate for the stabilization process based on a first stabilization factor, prior to initiating the stabilization process.

The control unit 130 may calculate the first stabilization factor using Equation 3 below.

$$F_1 = (R_{DV}/E_{cv}) \times K_2 \qquad \text{<Equation 3>}$$

In Equation 3, $F_1$ is the first stabilization factor, $R_{DV}$ is the reference value, and $K_2$ is a predetermined second conditioning value, which is a constant equal to or less than 1. $K_2$ may be predetermined in consideration of the electrochemical characteristics of the battery B.

If the reference value $R_{DV}$ is 0.0120, the average $E_{cv}$ is 0.0127 and the second conditioning value $K_2$ is 1, the first stabilization factor may be calculated as $F1 \approx 0.945$.

After that, the control unit 130 may determine the second current rate equal to the product of a threshold current rate of the battery B and the first stabilization factor. The threshold current rate may be predetermined as a maximum current rate (e.g., 0.05 C) available in the process of discharging the battery B through the stabilization process. Since the first stabilization factor is less than 1, the second current rate is less than the threshold current rate. For example, if the first stabilization factor is 0.945 and the threshold current rate is 0.05 C, the second current rate may be determined to be 0.04725 C.

Prior to initiating the stabilization process, the control unit 130 may determine a relaxation time for keeping the battery B in an idle state (i.e., a no-load state) based on a second stabilization factor. The control unit 130 may determine the product of a threshold time of the battery B and the second stabilization factor as the relaxation time. The threshold time is a minimum time required to stabilize the electrode material of the battery B and may be predetermined.

The second stabilization factor may be a reciprocal of the first stabilization factor. In this case, since the second stabilization factor is greater than 1, the relaxation time is longer than the threshold time. For example, if the second stabilization factor is 1.05 and the threshold time is 12 hours, the relaxation time may be determined to be 12.6 hours.

Alternatively, the relaxation time may be predetermined in advance as 12 hours, 24 hours, or the like.

The control unit 130 may control the relay 10 to be kept in an OFF-state during the relaxation time from an end time point of the sensing period or an initiation time point of the stabilization process. The control unit 130 may monitor whether the relaxation time passes by using a timer provided therein. During the relaxation time, the electrode material of battery B may be gradually stabilized.

When it is detected that the relaxation time has elapsed, the control unit 130 may control the relay 10 into an ON-state and output a control signal to the charging-discharging circuit 20 so as to induce the battery B to be discharged with a current of the second current rate. The discharge of the battery B by the second current rate may be terminated at a time point when the SOC of the battery B reaches the initial value.

As described above, as the electrode material of the battery B is more unstable (i.e., the smaller the first stabilization factor $F_1$), the second current rate decreases and the relaxation time increases. Thus, through the stabilization process, the electrode material of the battery B can be effectively stabilized.

The interface unit 140 supports wired or wireless communication between an external device and the battery management apparatus 100. The wired communication may be, for example, controller area network (CAN) communication, and the wireless communication may be, for example, Zigbee or Bluetooth communication. Data associated with the stabilization process executed by the control unit 130 may be output to the external device through a communication terminal (COM).

The interface unit 140 includes at least one of a display and a speaker. Data associated with the stabilization process may be output in visual form (e.g., symbols, numbers, etc.) via the display or in audio form (e.g., beep) via the speaker.

Figure 5:
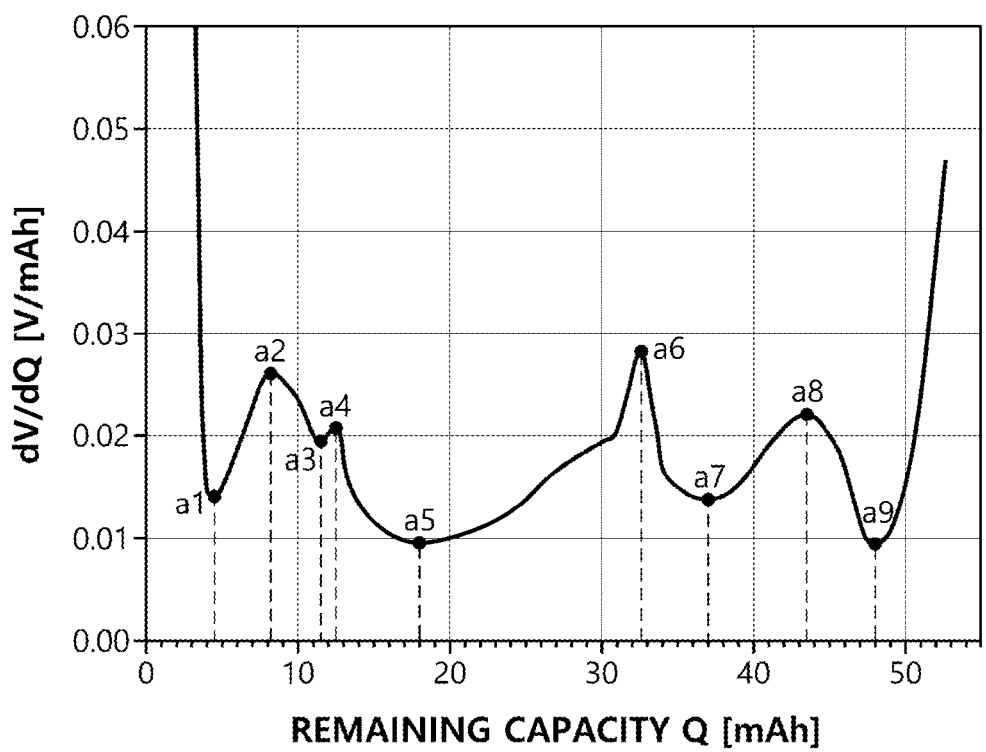
FIG. 5 is a graph showing another example of the differential voltage curve of the battery illustrated in FIG. 1.
Figure 6:
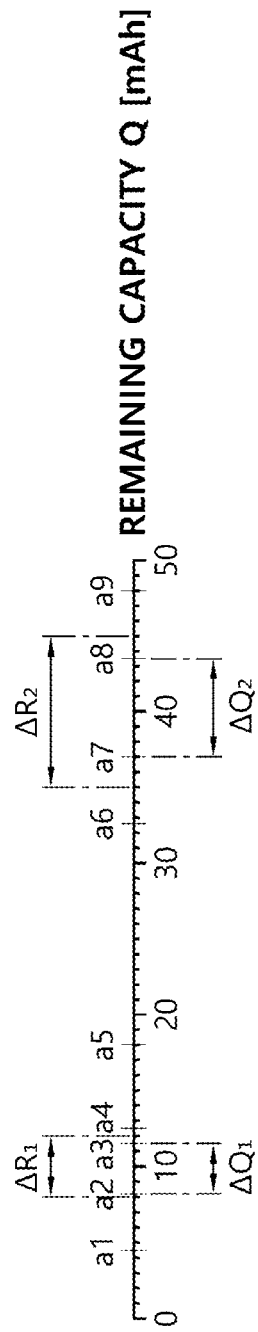
FIG. 6 is a graph referred to for explaining a process of diagnosing the degradation of the battery illustrated in FIG. 1 by analyzing the differential voltage curve illustrated in FIG. 5.

FIG. 5 is a graph showing another example of the differential voltage curve of the battery illustrated in FIG. 1, and FIG. 6 is a graph referred to for explaining a process of diagnosing the degradation of the battery illustrated in FIG. 1 by analyzing the differential voltage curve illustrated in FIG. 5.

The differential voltage curve shown in FIG. 5 may be newly determined after the stabilization process for the electrode material of the battery B, which has been degraded to some extent, is executed.

The control unit 130 may detect feature points a1 to a9 in the differential voltage curve. Hereinafter, it is assumed that the remaining capacities of the feature points a1 to a9 are 4.5 mAh, 8.2 mAh, 11.5 mAh, 12.5 mAh, 18.0 mAh, 32.5 mAh, 37.0 mAh, 43.5 mAh, and 48.0 mAh, in order.

Referring to FIG. 6, the control unit 130 may determine two of the feature points a1 to a9 as first electrode feature pointsbased on a predetermined first reference range ($\Delta R_1$) and determine other two of the feature points a1 to a9 as second electrode feature points based on a second reference range ($\Delta R_2$). The first electrode feature point is a parameter utilized for determining the degree of degradation of the first electrode (e.g., a negative electrode) of the battery B. The second electrode feature point is a parameter for determining the degree of degradation of the second electrode (e.g., a positive electrode) of the battery B.

The first reference range ($\Delta R_1$) may be predetermined based on a remaining capacity of an inflection point located in a specific order among the plurality of inflection points detected from the first reference voltage curve for the first electrode of the battery B when the battery B is in a beginning of life (BOL) state. The first reference voltage curve may indicate a corresponding relationship between the remaining capacity of the battery B and the voltage of the first electrode of the battery B when the battery B is in the BOL state. For example, the first reference range ($\Delta R_1$) may be predetermined in advance based on a remaining capacity having a second smallest magnitude among the remaining capacities of the plurality of inflection points detected from the first reference voltage curve.

The second reference range ($\Delta R_2$) may be predetermined in advance based on a remaining capacity of an inflection point located in a particular order among the plurality of inflection points detected from the second reference voltage curve for the second electrode of the battery B when the battery B is in the BOL state. The second reference voltage curve may indicate a corresponding relationship between the remaining capacity of the battery B and the voltage of the second electrode of the battery B when the battery B is in the BOL state. For example, the second reference range ($\Delta R_2$) may be predetermined in advance based on a remaining capacity having a second largest magnitude among the remaining capacities of the plurality of inflection points detected from the second reference voltage curve.

The process of acquiring the first reference voltage curve and the second reference voltage curve may be identical to the process of determining the differential voltage curve of FIG. 3. In addition, the process of detecting a plurality of inflection points of the first reference voltage curve and a plurality of inflection points of the second reference voltage curve may be identical to the process of detecting feature points a1 to a9 of the differential voltage curve of FIG. 5.

It is assumed that the first reference range ($\Delta R_1$) is 8 to 12 mAh, and the second reference range ($\Delta R_2$) is 35 to 45 mAh.

The control unit 130 may determine, among the feature points a1 to a9, the feature point a2 having the smallest remaining capacity within the first reference range ($\Delta R_1$) as the first electrode feature point. Next, the control unit 130 may further determine the feature point a3 where a difference value from the remaining capacity of the feature point a2 has the smallest remaining capacity among the feature points a3 to a9 having a remaining capacity larger than the remaining capacity of the feature point a2 as the first electrode feature point.

The control unit 130 may determine, among the feature points a1 to a9, the feature point a8 having the largest remaining capacity within the second reference range $\Delta R_2$ as the second electrode feature point. Next, the control unit 130 may further determine the feature point a7 where a difference value from the remaining capacity of the feature point a8 has the smallest remaining capacity among the feature points a1 to a7 having a remaining capacity smaller than the remaining capacity of the feature point a8 as the second electrode feature point.

Alternatively, the control unit 130 may determine two feature points positioned in a first predetermined order and a second predetermined order as the first electrode feature pointsamong the feature points a1 to a9, without utilizing the first reference range ($\Delta R_1$). The control unit 130 may determine two feature points positioned in a third predetermined order and a fourth predetermined order as the second electrode feature points among the feature points a1 to a9, without utilizing the second reference range ($\Delta R_2$). The first to fourth predetermined orders may be predetermined in advance in consideration of the electrochemical characteristics of a material of the positive electrode and a material of the negative electrode of the battery B.

Hereinafter, an operation for the control unit 130 to determine the state of degradation of the first electrode and the second electrode of the battery B based on two first electrode feature point and two second electrode feature points without conducting a three-electrode experiment will be described.

The control unit 130 may determine a first difference value indicating a remaining capacity difference ($\Delta Q_1$) between two first electrode feature points a2, a3. The inventor of the present disclosure has recognized that the remaining capacity difference ($\Delta Q_1$) decreases as the first electrode degrades. The control unit 130 may determine the degree of degradation of the first electrode based on a result of comparing the first difference value with a first reference difference value. The first reference difference value indicates the difference in remaining capacity between two first electrode feature points determined from the differential voltage curve when battery B is in the BOL state. The control unit 130 may calculate a first degradation value indicating the degree of degradation of the first electrode by using Equation 4 below.

$$W_1 = \{(D_{R1} - D_{B1})/D_{R1}\} \times U_1 \qquad \text{<Equation 4>}$$

In Equation 4, $D_{B1}$ is a first difference value, $D_{R1}$ is the first reference difference value, $U_1$ is a predetermined first correction value that is a constant equal to or less than 1, and $W_1$ is the first degradation value. The first correction value may be predetermined in advance in consideration of the electrochemical characteristics of the battery B. As the first degradation value $W_1$ is greater, it means that the first electrode degrades more.

The control unit 130 may determine a second difference value indicating a remaining capacity difference ($\Delta Q_2$) between two second electrode feature points a7, a8. The inventor of the present disclosure has recognized that as the second electrode degenerates, the remaining capacity difference ($\Delta Q_2$) decreases. The control unit 130 may determine the degree of degradation of the second electrode based on a result of comparing the second difference value with a second reference difference value. The second reference difference value indicates the difference in remaining capacity between two second electrode feature points determined from the differential voltage curve when the battery B is in the BOL state. The control unit 130 may calculate a second degradation value indicating the degree of degradation of the second electrode by using Equation 5 below.

$$W_2=\{(D_{R2}-D_{B2})/D_{R2}\}\times U_2 \qquad <\text{Equation 5}>$$

In Equation 5, $D_{B2}$ is the second difference value, $D_{R2}$ is the second reference difference value, $U_2$ is a predetermined second correction value that is a constant equal to or less than 1, and $W_2$ is the second degradation value. The second correction value may be predetermined in advance in consideration of the electrochemical characteristics of the battery B. As the second degradation value $W_2$ is greater, this means that the second electrode degrades more.

The control unit 130 may transmit a message indicating the degree of degradation of at least one of the first electrode and the second electrode to the external device through a communication terminal (COM) using the interface unit 140.

Figure 7:
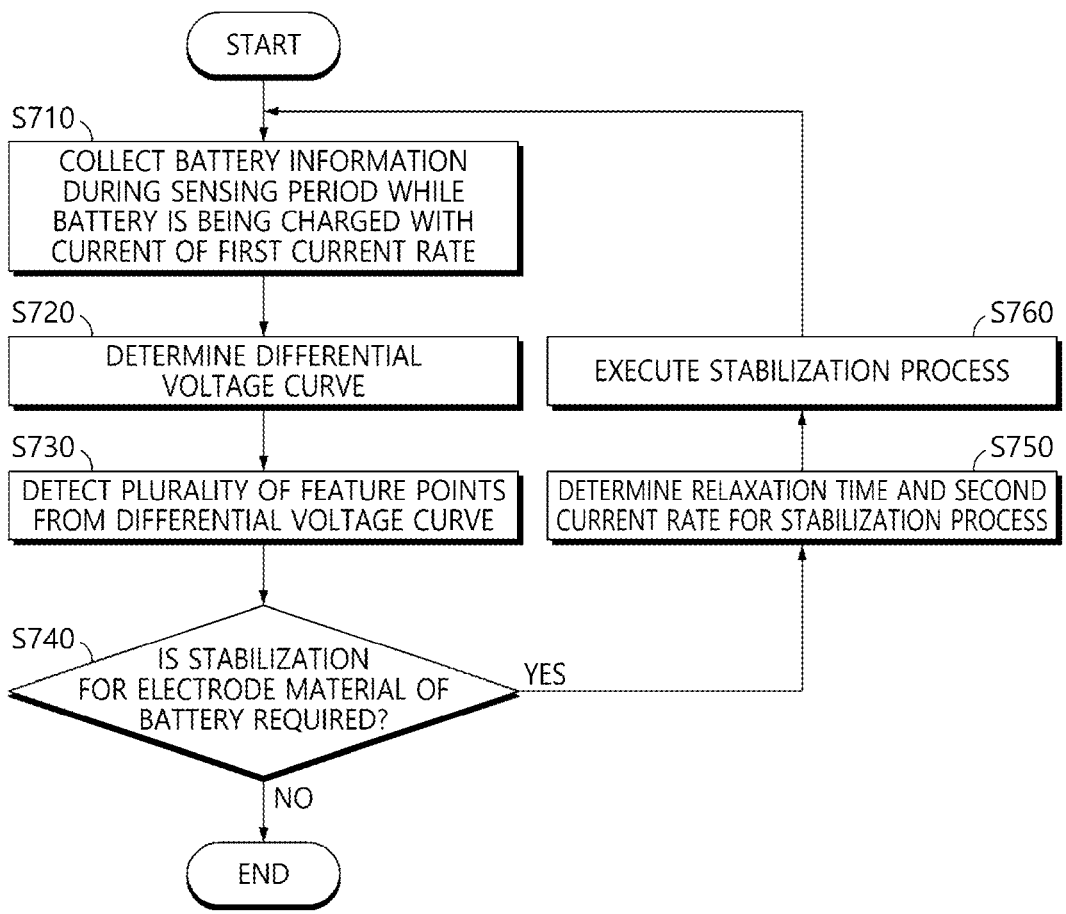
FIG. 7 is a flowchart of a method associated with a stabilization process executed by the battery management apparatus illustrated in FIG. 1.

FIG. 7 is a flowchart of a method associated with a stabilization process executed by the battery management apparatus illustrated in FIG. 1.

Referring to FIGS. 1 to 4 and 7, in the step S710, the control unit 130 collects battery information from the sensing unit 110 during a sensing period while the battery B is being charged with a current of the first current rate.

In the step S720, the control unit 130 determines a differential voltage curve based on a history of the collected battery information.

In the step S730, the control unit 130 detects a plurality of feature points from the differential voltage curve.

In the step S740, the control unit 130 determines whether stabilization for the electrode material of the battery B is required, based on the feature value of each of the plurality of feature points. If the value of step S740 is "YES", the step S750 is executed. If the value of step S740 is "NO", the process may proceed to the step S810 (see FIG. 8).

In the step S750, the control unit 130 determines the relaxation time and the second current rate for the stabilization process. The second current rate is smaller than the first current rate.

In the step S760, the control unit 130 executes the stabilization process. After the step S760 ends, the method may return to the step S710.

Figure 8:
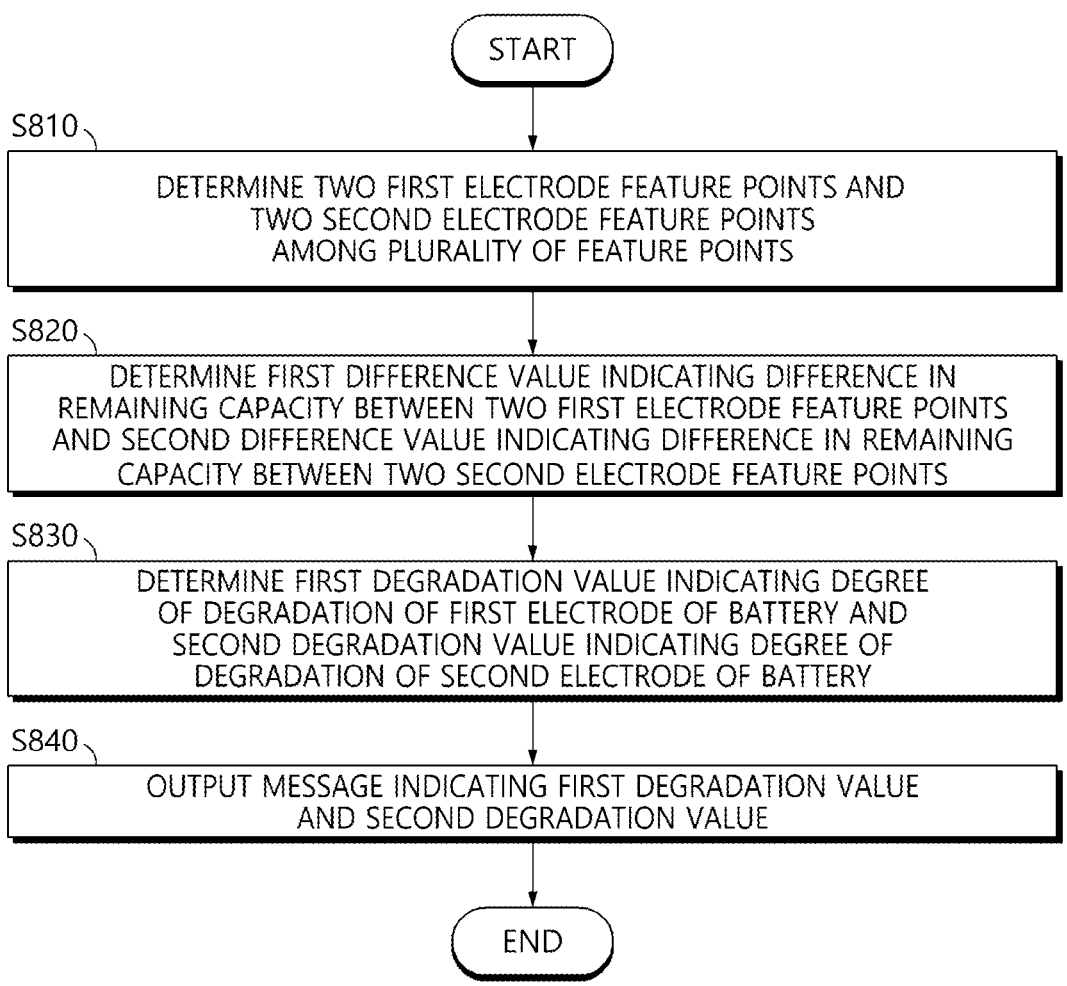
FIG. 8 is a flowchart of a method associated with a degradation diagnosing process executed by the battery management apparatus illustrated in FIG. 1.

FIG. 8 is a flowchart of a method associated with a degradation diagnosing process executed by the battery management apparatus illustrated in FIG. 1.

Referring to FIGS. 1, 5, 6 and 8, in the step S810, the control unit 130 determines two first electrode feature points a2, a3 and two second electrode feature points a7, a8 among the plurality of feature points.

In the step S820, the control unit 130 determines a first difference value indicating the difference in remaining capacity between two first electrode feature points a2, a3 and a second difference value indicating the difference in remaining capacity between two second electrode feature points a7, a8.

In the step S830, the control unit 130 determines a first degradation value indicating the degree of degradation of the first electrode of the battery B and a second degradation value indicating the degree of degradation of the second electrode of the battery B.

In the step S840, the control unit 130 outputs a message indicating the first degradation value and the second degradation value.

The embodiments of the present disclosure described above are not necessarily implemented by the apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A battery management apparatus, comprising:
   a sensing unit configured to generate battery information indicating a voltage and a current of a battery; and
   a control unit operably coupled to the sensing unit, the control unit being configured to:
     determine a differential voltage curve based on a history of the battery information provided from the sensing unit during a sensing period while the battery is being charged with a current of a first current rate, the differential voltage curve indicating a relationship between a remaining capacity of the battery and a ratio of a voltage change amount of the battery to a remaining capacity change amount of the battery during the sensing period;
     detect a plurality of feature points from the differential voltage curve;
     determine whether stabilization for an electrode material of the battery is required, based on a feature value of each of the plurality of feature points; and
     output a control signal to induce the battery to be discharged with a current of a second current rate, when it is determined that stabilization for the electrode material of the battery is required,
   wherein the second current rate is smaller than the first current rate.

2. The battery management apparatus according to claim 1, wherein the control unit is further configured to:
   calculate an absolute value of a difference between the feature values of every pair of two neighboring feature points among the plurality of feature points; and
   determine whether stabilization for the electrode material of the battery is required by comparing an average of the absolute values calculated for the every pair with a reference value.

3. The battery management apparatus according to claim 2, wherein the control unit is further configured to determine that stabilization for the electrode material of the battery is required, when the average is equal to or greater than the reference value.

4. The battery management apparatus according to claim 2, wherein the control unit is further configured to determine the second current rate based on a first stabilization factor associated with a ratio between the reference value and the average, when it is determined that stabilization for the electrode material of the battery is required.

5. The battery management apparatus according to claim 4, wherein:
the second current rate is equal to the product of the first stabilization factor and a threshold current rate; and
the threshold current rate is a maximum current rate available in a stabilization process.

6. The battery management apparatus according to claim 4, wherein the control unit is further configured to:
determine a relaxation time based on a second stabilization factor associated with a ratio between the reference value and the average, when it is determined that stabilization for the electrode material of the battery is required; and
output the control signal at a time point when the relaxation time passes from an end of the sensing period.

7. The battery management apparatus according to claim 6, wherein:
the second stabilization factor is a reciprocal of the first stabilization factor; and
the relaxation time is equal to the product of the second stabilization factor and a threshold time.

8. A battery pack, comprising the battery management apparatus according to claim 1.

9. An electric vehicle, comprising the battery pack according to claim 8.

10. A battery management method using the battery management apparatus according to claim 1, wherein the control unit is further configured to:
collect the battery information from the sensing unit during the sensing period;
determine the differential voltage curve based on the history of the collected battery information;
detect the plurality of feature points from the differential voltage curve;
determine whether stabilization for the electrode material of the battery is required, based on a feature value of each of the plurality of feature points; and
output the control signal to induce the battery to be discharged with a current of the second current rate, when it is determined that stabilization for the electrode material of the battery is required,
wherein the second current rate is smaller than the first current rate.

11. The battery management method according to claim 10, wherein it is determined that stabilization for the electrode material of the battery is required, when an average of an absolute value of a difference between the feature values of every pair of two neighboring feature points among the plurality of feature points is equal to or greater than a reference value.

12. The battery management method according to claim 11, wherein:
the second current rate is equal to the product of a first stabilization factor associated with a ratio between the reference value and the average and a threshold current rate; and
the threshold current rate is a maximum current rate available in a stabilization process.

* * * * *